(12) United States Patent
Yang et al.

(10) Patent No.: US 10,615,720 B2
(45) Date of Patent: Apr. 7, 2020

(54) POWER GENERATOR, MANUFACTURING METHOD, AND ELECTRONIC DEVICE

(71) Applicant: BOE TECHNOLOGY GROUP CO., LTD., Beijing (CN)

(72) Inventors: Jiuxia Yang, Beijing (CN); Feng Bai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/325,297

(22) PCT Filed: Jul. 1, 2016

(86) PCT No.: PCT/CN2016/088170
§ 371 (c)(1),
(2) Date: Jan. 10, 2017

(87) PCT Pub. No.: WO2017/121079
PCT Pub. Date: Jul. 20, 2017

(65) Prior Publication Data
US 2018/0323730 A1 Nov. 8, 2018

(30) Foreign Application Priority Data
Jan. 11, 2016 (CN) .......................... 2016 1 0016300

(51) Int. Cl.
*H01L 41/113* (2006.01)
*H01L 41/193* (2006.01)
(Continued)

(52) U.S. Cl.
CPC ........... *H02N 2/18* (2013.01); *H01L 41/0475* (2013.01); *H01L 41/0478* (2013.01);
(Continued)

(58) Field of Classification Search
CPC ............... H01L 41/113; H01L 41/1132; H01L 41/1134; H01L 41/1136; H01L 41/1138
(Continued)

(56) References Cited

U.S. PATENT DOCUMENTS 5,951,908 A 9/1999 Cui et al.
9,093,633 B2 7/2015 Hwang et al.
(Continued)

FOREIGN PATENT DOCUMENTS

CN 102079818 A 6/2011
CN 202975616 U 6/2013
(Continued)

OTHER PUBLICATIONS

1st Office Action dated Jul. 8, 2016 in CN201610016300.8.
(Continued)

*Primary Examiner* — Derek J Rosenau
(74) *Attorney, Agent, or Firm* — Syncoda LLC; Feng Ma (57) ABSTRACT

The present disclosure provides a power generator, its manufacturing method, and an electronic device utilizing the power generator as its power source. The power generator includes a deformation unit and a piezoelectric unit. The deformation unit is coupled to the piezoelectric unit; and the deformation unit comprises a conductive polymer, which is configured to deform upon contacting moisture to thereby apply a mechanical force to the piezoelectric unit to thereby generate electricity.

11 Claims, 3 Drawing Sheets

(51) Int. Cl.
*H02N 2/18* (2006.01)
*H01L 41/45* (2013.01)
*H01L 41/18* (2006.01)
*H01L 41/331* (2013.01)
*H01L 41/047* (2006.01)
*H01L 41/29* (2013.01)
*H01L 41/053* (2006.01)
*H01L 41/25* (2013.01)
*H01L 41/37* (2013.01)
*H02N 2/00* (2006.01)
*G04G 19/00* (2006.01)

(52) U.S. Cl.
CPC ........ *H01L 41/0536* (2013.01); *H01L 41/113* (2013.01); *H01L 41/1136* (2013.01); *H01L 41/183* (2013.01); *H01L 41/193* (2013.01); *H01L 41/25* (2013.01); *H01L 41/29* (2013.01); *H01L 41/331* (2013.01); *H01L 41/37* (2013.01); *H01L 41/45* (2013.01); *H02N 2/22* (2013.01); *G04G 19/00* (2013.01)

(58) Field of Classification Search
USPC .......................................... 310/339
See application file for complete search history.

(56) References Cited

U.S. PATENT DOCUMENTS

| | | | |
|---|---|---|---|
| 2010/0164231 A1* | 7/2010 | Tsou | F03D 5/00 |
| | | | 290/55 |
| 2012/0074814 A1* | 3/2012 | Chang | H02N 2/18 |
| | | | 310/339 |
| 2014/0125196 A1 | 5/2014 | Ma et al. | |
| 2017/0029985 A1* | 2/2017 | Tajitsu | D03D 15/00 |
| 2017/0373243 A1* | 12/2017 | Ozawa | B06B 1/06 |
| 2018/0242851 A1* | 8/2018 | Van Den Ende | G01K 7/24 |

FOREIGN PATENT DOCUMENTS

| | | |
|---|---|---|
| DE | 2922260 A1 | 12/1979 |
| DE | 102008023517 A1 | 12/2009 |
| JP | S6320883 A | 1/1988 |
| WO | 9935670 A2 | 7/1999 |

OTHER PUBLICATIONS

2nd Office Action dated Sep. 21, 2016 in CN201610016300.8.
3rd Office Action dated Jan. 19, 2017 in CN201610016300.8.
4th Office Action dated May 29, 2018 in CN201610016300.8.
International Search Report and Written Opinion dated Oct. 14, 2016 in PCT/CN2016/088170.
Extended European Search Report dated Jul. 31, 2019 in EP16816160.2.

* cited by examiner

POWER GENERATOR, MANUFACTURING METHOD, AND ELECTRONIC DEVICE

CROSS-REFERENCE TO RELATED APPLICATION

The present application claims priority to Chinese Patent Application No. 201610016300.8 filed on Jan. 11, 2016, the disclosure of which is hereby incorporated by reference in its entirety.

TECHNICAL FIELD

The present disclosure relates generally to the field of electronic device, and more specifically to a power generator, its manufacturing method, and an electronic device.

BACKGROUND

For miniaturized electronic devices such as cellular phones and smart wearable devices, to accommodate their very limited sizes, the batteries are accordingly very small, with very limited battery life. The battery life has become a bottleneck to usefulness of small electronic devices particularly wearable electronic devices.

SUMMARY

The present disclosure provides a power generator, its manufacturing method, and an electronic device utilizing the power generator as its power source. The battery life of electronic devices can be improved by employing the power generator.

In an aspect, a power generator is provided, which includes a deformation unit and a piezoelectric unit. The deformation unit is coupled to the piezoelectric unit; and the deformation unit comprises a conductive polymer, which is configured to deform upon contacting moisture to thereby apply a mechanical force to the piezoelectric unit to thereby generate electricity. Herein, the term "coupled" is used to refer to the structural and functional relationship between the deformation unit and the piezoelectric unit, which can be direct or indirect contact, and can involve mechanical contact or some other types of contact, and there are no limitations herein.

In some embodiments of the power generator, the conductive polymer can be at least one of poly(3,4-ethylenedioxythiophene), poly(styrenesulfonate), poly-phenylenevinylene, polypyrrole, polythiophene, polysilane, triphenylmethane, triarylamine, or pyrazoline.

In some embodiments of the power generator, the piezoelectric unit can include a piezoelectric portion, two electrodes and two electrode lead wires. The piezoelectric portion can comprise a piezoelectric material; the two electrodes are coupled respectively to two sides of, and are configured to output a voltage from, the piezoelectric portion when the piezoelectric portion generates electricity; and the two electrode lead wires, coupled respectively to the two electrodes and configured to output the voltage outside the power generator.

In some of the embodiments, the piezoelectric material can be a composite piezoelectric material, which can comprise a first substrate, comprising an organic polymer, and a piezoelectric composition, embedded in the first substrate. In some embodiments, the piezoelectric composition can be a piezoelectric ceramic, selected from an xBaTiO$_3$, or a metaniobate. The metaniobate can be Na$_{0.5}$.K$_{0.5}$.NbO$_3$ and Ba$_x$.Sr$_{1-x}$.Nb$_2$O$_5$. In some other embodiments, the piezoelectric composition can be a piezoelectric crystal, such as SiO$_2$, LiGaO$_2$, Li$_2$GeO$_3$, Ti$_2$GeO$_3$, LiNbO$_3$:Fe, and LiTaO$_3$.

In some of the embodiments, the piezoelectric material can be an organic piezoelectric material comprising polyvinylidene fluoride.

In some embodiments of the power generator, the piezoelectric unit can further include two insulating layers. The two insulating layers are respectively disposed over the two electrodes, and configured to insulate from environment; and the two electrode lead wires each runs through one of the two insulating layers and has at least one part outside the one of the two insulating layers.

In some embodiments of the power generator, the conductive polymer can be in direct contact with the piezoelectric unit.

In some other embodiments, the power generator can further include a second substrate, which is disposed between the conductive polymer and the piezoelectric unit. The second substrate can comprise at least one of TPU (thermoplastic polyurethane), TPSiV, TPV (thermoplastic vulcanizate), TPE (thermoplastic elastomer), TPO (theroplastic polyolefin), LSR (liquid silicone rubber), and HCR (high consistency rubber).

In some embodiments, the power generator can further comprise a second conductive polymer, which is disposed over a second side of the piezoelectric unit, and is configured to deform upon contacting moisture to thereby apply a second mechanical force to the piezoelectric unit.

In another aspect of the present disclosure, an electronic device is provided, which includes the power generator as described in any of the above mentioned embodiments. The power generator is configured to supply at least part of electricity to the electronic device.

In some embodiments, the electronic device can a wearable device, and the conductive polymer in the power generator is disposed at a side of the electronic device in direct contact with skin of a subject such as a human being, or an animal.

In yet another aspect of the present disclosure, a method for fabricating a power generator is provided. The method can comprise the steps of:

Forming a piezoelectric unit; and

Forming a deformation unit over the piezoelectric unit.

The deformation unit can comprise a conductive polymer, which is configured to deform upon a variation in moisture and thereby apply a mechanical force to the piezoelectric unit to thereby generate electricity.

In some embodiments of the method, the step of forming the piezoelectric unit comprises a sub-step of fabricating a piezoelectric film layer. The piezoelectric film layer can comprise a piezoelectric material.

In some of the embodiments, the piezoelectric material can be an organic piezoelectric material, and the piezoelectric film layer can be fabricated via membrane-pulling and curing, spin coating, or printing.

In some of the embodiments, the piezoelectric material can be a composite piezoelectric material, and the piezoelectric film layer can be fabricated by embedding piezoelectric crystals or piezoelectric ceramics in an organic polymer substrate.

In some of the embodiments of the method, the step of forming a deformation unit over the piezoelectric unit comprises the sub-steps of:

Fabricating the conductive polymer via a coating or a curing process; and

Bonding the conductive polymer with surface of at least one side of the piezoelectric unit.

In some of the embodiments, the sub-step of bonding the conductive polymer with surface of at least one side of the piezoelectric unit is realized via an adhesive layer, disposed between the conductive polymer and the surface of at least one side of the piezoelectric unit.

In some embodiments of the method, the step of forming a deformation unit over the piezoelectric unit comprises the sub-steps of:

Providing a conductive polymer solution, wherein the conductive polymer solution comprises the conductive polymer, a solvent and a resin;

Coating the conductive polymer solution over surface of at least one side of the piezoelectric unit; and Curing the conductive polymer solution to form a deformation unit.

In some of the embodiments, the conductive polymer in the conductive polymer solution has a concentration of about 40%-85% by weight, and comprises at least one of poly(3,4-ethylenedioxythiophene), poly(styrenesulfonate), poly-phenylenevinylene, polypyrrole, polythiophene, polysilane, triphenylmethane, triarylamine, or pyrazoline.

In some of the embodiments, the solvent in the conductive polymer solution has a concentration of about 20%-60% by weight, and comprises at least one of a ketone, an ester, an ether, an aliphatic hydrocarbon, a naphthene-based compound, or an aromatic hydrocarbon.

In some of the embodiments, the resin in the conductive polymer solution has a concentration of about 5%-15% by weight, and comprises at least one of an acrylic resin or an epoxy acrylate resin copolymer.

In some embodiments, the method can further include between the step of forming a piezoelectric unit and the step of forming a deformation unit over the piezoelectric unit, a step of:

Forming a substrate between the deformation unit and the piezoelectric unit, wherein the substrate comprises at least one of TPU (thermoplastic polyurethane), TPSiV, TPV (thermoplastic vulcanizate), TPE (thermoplastic elastomer), TPO (theroplastic polyolefin), LSR (liquid silicone rubber), and HCR (high consistency rubber).

In some of the embodiments, the substrate can be formed via inject molding, mold pressing, or injection.

Other embodiments and implementations may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

The disclosure provides a power generator, as shown in FIG. 1A, FIG. 1B, FIG. 4A and FIG. 4B. The power generator 01 comprises: a deformation unit 10 and a piezoelectric unit 20. The deformation unit 10 comprises a polymer film layer, and the polymer film layer comprises a conductive polymer material. The piezoelectric unit 20 is configured to output voltage under mechanical forces, and the deformation unit 10 is configured to generate the mechanical forces that are applied onto the piezoelectric unit 20 when it is deformed.

Under a humid environment, when water molecules come into contact with the network structure of a conductive polymer material in the polymer film layer as disclosed in the embodiments, the water molecules can be absorbed and covered by the atoms of the conductive polymer material which, in turn results in the movement and vibration of the conductive polymer material, causing the polymer film layer to be contracted and deformed, and ultimately driving the piezoelectric unit to produce charge. Considering that electronic devices, especially smart wearable electronic devices, can be in contact with the human skin, the humid environment for the polymer film layer can be provided by sweating.

The following is noted. First, because the power generator 01 as disclosed herein serves to generate power, those skilled in the art should understand that the deformation unit 10 can still be deformed when there is no need for electricity. Second, the structure and material of the piezoelectric unit 20 shall be configured and selected such that the piezoelectric unit 20 can output voltage under mechanical forces, such as squeezing, pressing, stretching or elongating, from the deformation unit 10 when it is deformed.

In the power generator 01 as described above, the deformation unit 10 is deformed to generate mechanical forces acting on the piezoelectric unit 20, which in turn outputs voltage under the mechanical forces, thereby generating power. When the power generator 01 is incorporated in electronic devices, the battery life of the devices can be improved and the user experience can be enhanced.

Figure 1A:
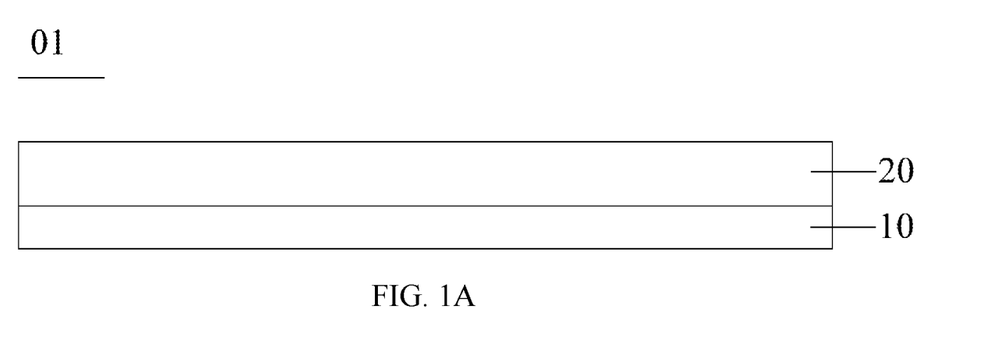
FIG. 1A is schematic view of a power generator according to a first embodiment.
Figure 1B:
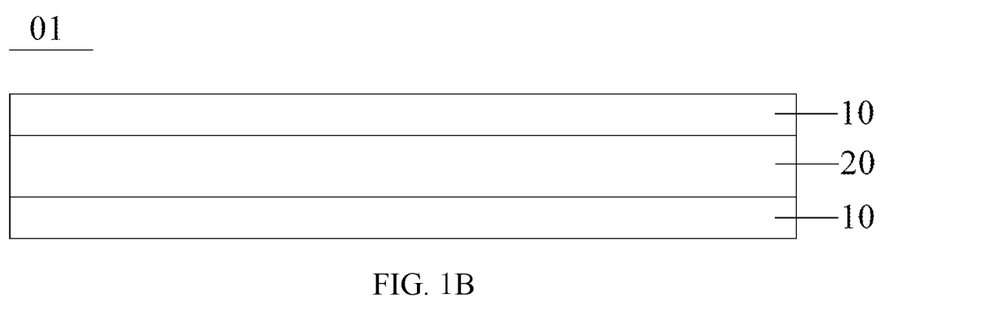
FIG. 1B is schematic view of a power generator according to a second embodiment.
Figure 4A:
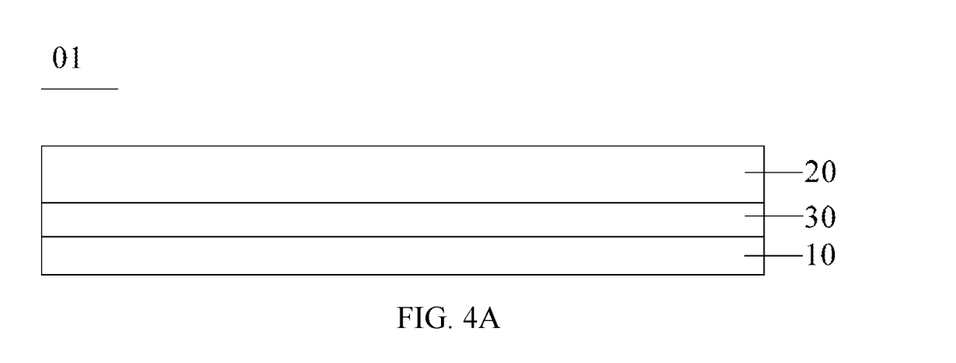
FIG. 4A is schematic view of the power generator according to a third embodiment of the present disclosure.
Figure 4B:
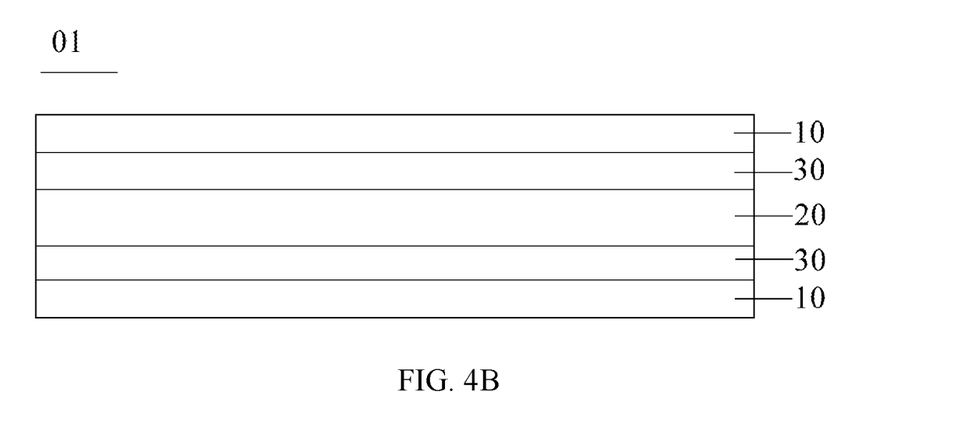
FIG. 4B is schematic view of the power generator according to a fourth embodiment of the present disclosure.

Under a situation where the deformation unit 10 is configured at both sides of the piezoelectric unit 20, as illustrated in FIG. 1B and FIG. 4B, because the power generator 01 is typically employed in electronic devices, especially in miniaturized electronic devices such as cell phones and smart wearable devices, it is not easy to deform the deformation unit 10 at both sides of the piezoelectric unit 20 due to the limitation by such structures, thus in a preferred power generators 01, the deformation unit 10 is configured at only one side of the piezoelectric unit 20, as illustrated in FIG. 1A or FIG. 4A.

Considering the stability and film-forming properties of the polymer film layer in the air or under moisture conditions, the conductive polymer material for the polymer film layer can include at least one of poly(3,4-ethylenedioxythiophene), poly(styrenesulfonate), poly-phenylenevinylene, polypyrrole, polythiophene, polysilane, triphenylmethane, triarylamine or pyrazoline.

Figure 2:
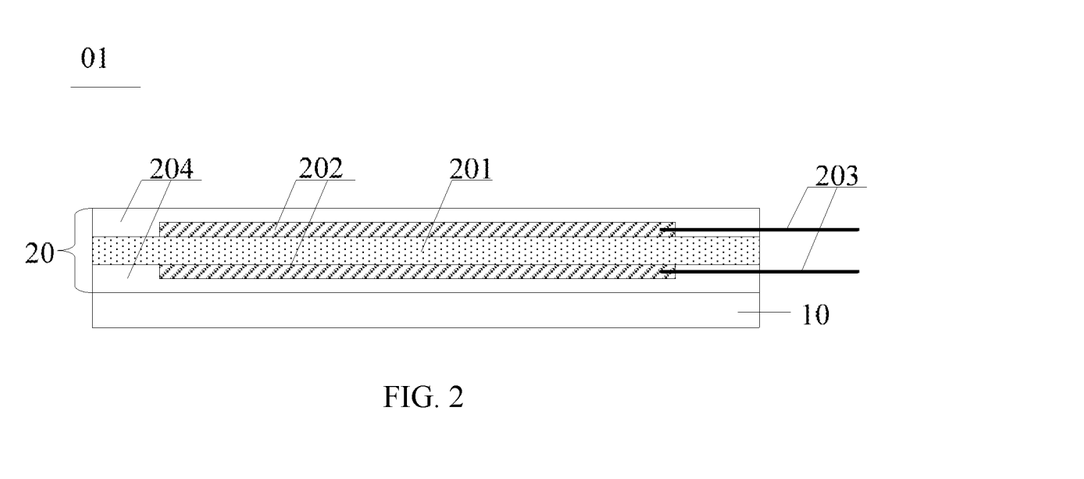
FIG. 2 is a schematic view of the specific structure of the power generator based on FIG. 1A.
Figure 5:
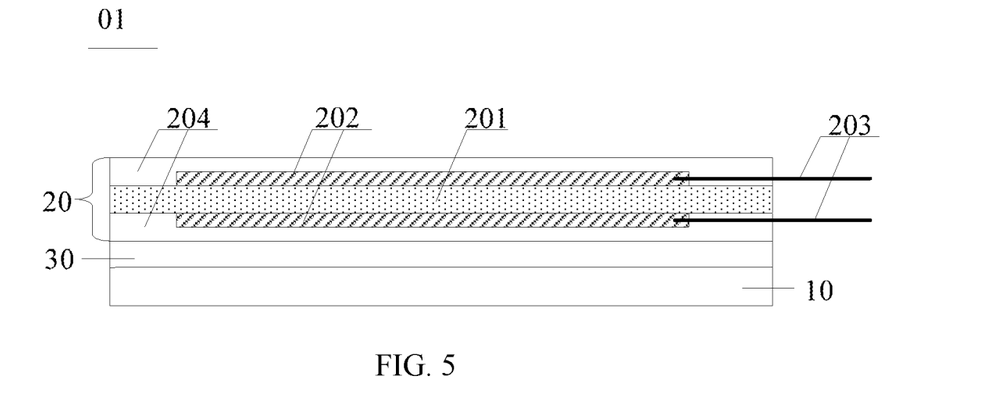
FIG. 5 is a schematic view of the specific structure of the power generator based on FIG. 4B.

In some embodiments as shown in FIG. 2 and FIG. 5, the piezoelectric unit 20 comprises a power generation film layer 201, two electrodes 202 that are respectively disposed on surfaces of two sides of the power generation film layer 201 that is close to and far away from the deformation unit 10, two electrode lead wires 203 that are connected to the electrodes 202, and two insulating layers 204 that respectively cover the two electrodes 202.

In these embodiments of the disclosure, the power generation film layer 201 comprises a piezoelectric material. The mechanical force generated by the deformation unit 10 and applied upon the piezoelectric unit 20 causes the power generation film layer 201 to deform, resulting in relative migration of charged particles and distribution of positive charge and negative charge on the surface of the power generation film layer 201, thereby generating an electric potential difference between its two end surfaces.

As such, by configuring the electrodes 202 over the surface of the power generation film layer 201 and the electrode lead wires 203 connected to the electrodes 202, the above-described electric potential difference can be collected, channeled out, and outputted as voltage. By connecting the electrode lead wires 203 with a device that needs to be charged, the device can be charged.

In addition, the insulating layers 204 can protect the electrodes 202, which are configured to avoid the loss of, or the interference to, charges on the electrodes 202 under environmental influences.

It should be noted that the present disclosure sets no limitation to the connection methods of the electrodes 202 and the electrode lead wires 203, as long as they are coupled to each other.

Furthermore, because the function of the electrode lead wires 203 is to output the above-described voltage to the device that need to be charged, the electrode lead wires 203 need to go through the insulating layers 204, and the length of the portion that is outside shall be set reasonably according to needs.

In some embodiments, the material in the power generation film layer 201 can be an organic piezoelectric material or a composite piezoelectric material. If the power generation film layer 201 comprises a composite piezoelectric material, the power generation film layer 201 can include a substrate comprising an organic polymer, and a piezoelectric crystal or a piezoelectric ceramic, embedded in the substrate.

If the power generation film layer 201 comprises an organic piezoelectric material, the power generation film layer 201 can be prepared from polyvinylidene fluoride.

If the power generation film layer comprises a composite piezoelectric material, the power generation film layer 201 can be prepared through embedding of sheet-shaped, block-shaped, rod-shaped or powder-shaped piezoelectric crystals or piezoelectric ceramics in the organic polymer substrate material. Examples of the piezoelectric ceramics that can be embedded include xBaTiO3, and a metaniobate (e.g. $Na_{0.5}.K_{0.5}.NbO_3$ and $Ba_x.Sr_{1-x}.Nb_2O_5$). Examples of the piezoelectric crystals that can be embedded include $SiO_2$, $LiGaO_2$, $Li_2GeO_3$, $Ti_2GeO_3$, $LiNbO_3$:Fe, and $LiTaO_3$.

With regard to the above piezoelectric crystals, because they are non-centrosymmetric crystals, under the action of mechanical forces polarization occurs inside the piezoelectric crystals, resulting in relative migration of the charged particles and distribution of charges of different signs over the surface of the crystals, thereby generating electric potential difference at the two ends of the polar axis of the piezoelectric crystals. When the mechanical forces are removed, it returns to the uncharged state.

With regard to the above piezoelectric ceramics, under the action of the mechanical forces, the center of inside positive and negative charges migrates relatively to generate polarization, which in turn generates bound charges with different signs over the surface of the ceramic, thereby generating the electric potential difference at its two end surfaces.

In some embodiments, the material of the electrodes 202 comprises at least one of a metal, a metal oxide or a nanocarbon material.

The electrode lead wires 203 can be a conductive wire, or a conductive silver paste wire.

Considering that the power generator 01 may come into contact with skin when it is employed in electronic devices, such as smart wearable devices, it can be configured, for example, to be on a wristband structure. As such, the power generator 01 can have a flexible structure, in order to ensure the user to feel comfortable.

Figure 3:
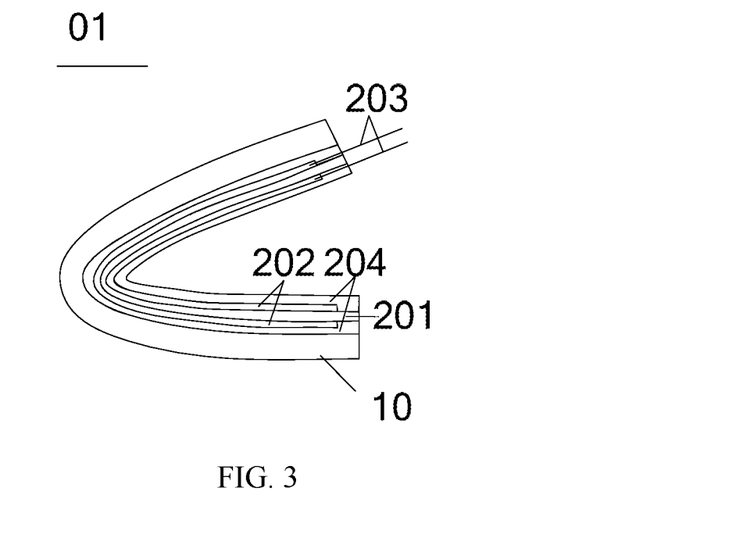
FIG. 3 is a schematic view of a flexible power generator according to some embodiments of the present disclosure.

As shown in FIG. 3, the power generator 01 can be bent at will. The deformation unit 10 can be configured to contact with the piezoelectric unit 20.

Herein it is fine as long as the mechanical forces generated when the deformation unit 10 is deformed can be transmitted to the power generate unit 20 so that the piezoelectric unit 10 can output voltage under the action of the mechanical forces. As such the deformation unit 10 may or may not be in direct contact with the piezoelectric unit 20.

In some embodiments, as shown in FIG. 1A, FIG. 1B and FIG. 2, the deformation unit 10 and the piezoelectric unit may be in direct contact with the piezoelectric unit 20.

In some other embodiments, as shown in FIG. 4A, FIG. 4B and FIG. 5, the power generator 01 may further comprise a substrate 30, which is disposed between the deformation unit 10 and the piezoelectric unit 20, and the deformation unit 10 and the piezoelectric unit 20 are configured to both contact with the substrate 30.

Herein by configuring the substrate 30, the flexibility of the whole power generator 01 can be controlled based on the flexibility of the substrate 30. As such, through appropriate selection of the material for the substrate 30, the application requirements of the power generator 01 can be satisfied and the range of applications of the power generator 01 can be enlarged.

It should be noted that the thickness of the substrate can be set according to the material of the substrate 30, as long as the mechanical forces generated by the deformation unit 10 and applied to the piezoelectric unit 20 when it is deformed are not influenced.

Considering that when the power generator 01 is manufactured as a flexible structure, the range of applications will be wider, in some embodiments, the material of the substrate 30 can be at least one of TPU (thermoplastic polyurethane), TPSiV, TPV (thermoplastic vulcanizate), TPE (thermoplastic elastomer), TPO (thermoplastic polyolefin), LSR (liquid silicone rubber), and HCR (high consistency rubber).

When employing the above material in the substrate, the molding processes can be injection molding, mold pressing, or injection etc.

The present disclosure further provides an electronic device, comprising a main body and the above-described power generator 01. The power generator 01 is employed to generate power to the main body of the electronic device.

Figure 6:
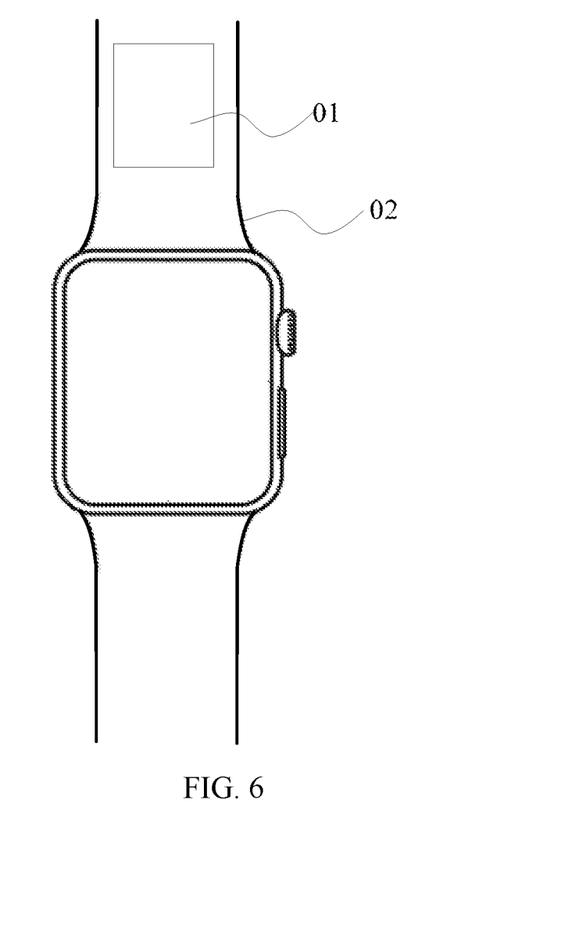
FIG. 6 is a schematic diagram of the structure of a smart wearable product according to some embodiments of the present disclosure.

For example, the electronic device can be a smart wearable device, as shown in FIG. 6. The smart wearable product comprises a main body 02 and a power generator 01, and the power generator 01 is employed to generate power to the main body 02.

It should be noted that, FIG. 6 only schematically illustrates the configuration of the power generator 01 over the wristband of the smart wearable product. Embodiments of the disclosure are not limited to this. According to the different types of the smart wearable devices, the power generator 01 can be configured at any locations, as long as it can generate power to the smart wearable product main body 02.

In order to provide a humid environment for the polymer film layer, preferably the deformation unit 10 is configured at the side of the electronic device that is in contact with the skin of the user. As such, the sweat of the skin can provide a humid environment to the polymer film layer.

Considering that smart wearable products are widely used and their battery life is relatively poor at present time, preferably the electronic device is a smart wearable device. In some embodiments, the smart wearable products can be a smart watch, or a smart wristband etc.

The present disclosure further provides a manufacturing method of a power generator 01 as shown in FIG. 1A and FIG. 1B, the method comprising the following steps:

S10. Forming a piezoelectric unit 20 that is configured to be able to output voltage under a mechanical force.

S11. Forming a deformation unit 10 over the surface of the piezoelectric unit 20, wherein the deformation unit 10 is capable of deforming and configured to generate a mechanical force and transmit the mechanical force to the piezoelectric unit 20 when deforming. The deformation unit 10 comprises a polymer film layer, and the polymer film layer comprises a conductive polymer.

Herein it is configured so as to maximize the mechanical forces generated by the deformation of the deformation unit 10 and applied to the piezoelectric unit 20.

In some embodiments of the disclosure, by deforming the deformation unit 10, a mechanical force acts on the piezoelectric unit 20, so that the piezoelectric unit can output voltage under the action of the mechanical force, thereby the power generation function is realized.

In some embodiments, the deformation unit 10 is only formed over the surface of one side of the piezoelectric unit 20.

As shown in FIG. 2, step S10 of forming a piezoelectric unit 20 comprises the following sub-steps:

S20. Forming a power generation film layer 201, wherein the power generation film layer 201 comprises a piezoelectric material.

S21. Forming electrodes 202 over the surfaces of two sides of the power generation film layer 201 that is close or far away from the deformation unit 10.

S22. Forming electrode lead wires 203 that are coupled to the electrodes 202.

S23. Forming insulating layers 204 that covers each of the electrodes 202.

The material of power generation film layer 201 can be an organic piezoelectric material or a composite piezoelectric material. If the material of the power generation film layer 201 is a composite piezoelectric material, the power generation film layer 201 comprises an organic polymer substrate and an embedded piezoelectric crystal or piezoelectric ceramic.

If the material of the power generation film layer 201 is an organic piezoelectric material, e.g. polyvinylidene fluoride, the power generation film layer can be fabricated through a membrane-pulling and curing process or another film fabrication process such as spin-coating or printing, etc.

If the material of the power generation film layer is a composite piezoelectric material, the power generation film layer 201 can be prepared through embedding of sheet-shaped, column-shaped, rod-shaped or powder-shaped piezoelectric crystals or piezoelectric ceramics in the organic polymer substrate material. Examples of the piezoelectric ceramics that can be embedded include $xBaTiO3$, and a metaniobate (e.g. $Na_{0.5}.K_{0.5}.NbO_3$ and $Ba_x.Sr_{1-x}.Nb_2O_5$). Examples of the piezoelectric crystals that can be embedded include $SiO_2$, $LiGaO_2$, $Li_2GeO_3$, $Ti_2GeO_3$, $LiNbO_3$:Fe, and $LiTaO_3$.

The material of the electrode 202 comprises at least one of a metal, a metal oxide or a nanocarbon material.

If the material of the electrode 202 is a nanocarbon material, the nanocarbon material can be bonded and cured over the surface of the power generation film layer 201 through a film-pulling and curing process, or bonding process.

The material for the electrode lead wires 203 can be a conductive wire, or a conductive silver paste wire.

The insulating layer 204 can be prepared through a coating process.

In embodiments of the present disclosure, the power generation film layer 201 comprises a piezoelectric material. When the mechanical force generated by the deformation unit 10 acts on the piezoelectric unit 20, the power generation film layer 201 will be deformed, causing relative migration of the charged particles and distribution of positive charge and negative charge on the surface of the power generation film layer 201, thereby generating an electric potential difference between its two end surfaces.

As such, by forming the electrodes 202 over the surface of the power generation film layer 201 and the electrode lead wires 203 that are connected to the electrodes 202, the above-described electric potential can be collected and form the output voltage. By connecting the electrode lead wires 203 and the devices that need to be charged, charging of the devices can be achieved. The insulating layer 204 can protect the electrodes 202.

In some embodiments, step S11 of forming the deformation unit 10 over the surface of the piezoelectric unit 20 can be achieved through the following two methods:

Method 1, comprising the following sub-steps:

S30. Fabricating a conductive polymer material into a polymer film layer via a coating process or a curing process.

S31. Forming an adhesive layer over the polymer film layer.

After forming the adhesive layer over the polymer film layer, a protective layer can be bonded over the adhesive layer first to protect the adhesiveness of the adhesive layer. Before executing the following sub-step S32, the protective layer can be removed.

S32. Aligning the polymer film layer with the piezoelectric unit 20, and bonding the adhesive layer over the polymer film layer with the piezoelectric unit 20 to form the polymer film layer over the surface of one side of the piezoelectric unit 20.

Method 2, comprising the following sub-steps:

S40. Preparing a conductive polymer solution, wherein the conductive polymer solution comprises conductive polymer, solvent and resin. In the conductive polymer solution, the content of the conductive polymer can be 40%-85% wt, the content of the solvent can be 20%-60% wt, and the content of resin can be 5%-15% wt. It should be noted that the content of the above-described conductive polymer, solvent and resin are percentages by weight.

The conductive polymer may comprise at least one of poly(3,4-ethylenedioxythiophene), poly(styrenesulfonate), poly-phenylenevinylene, polypyrrole, polythiophene, polysilane, triphenylmethane, triarylamine or pyrazoline.

The solvent may comprise at least one of a ketone, an ester, an ether, an aliphatic hydrocarbon, a naphthene-based compound, or an aromatic hydrocarbon.

The resin may comprise at least one of an acrylic resin or an epoxy acrylate resin copolymer.

S41. Coating the conductive polymer solution over surface of one side of the piezoelectric unit 20.

S42. Curing the conductive polymer solution to form the polymer film layer.

The present disclosure further provides a manufacturing method of a power generator 01 as shown in FIG. 4A and FIG. 4B, the method comprising the following steps:

S50. Forming a piezoelectric unit 20 that outputs voltage under the action of the mechanical forces.

S51. Forming a substrate 30 over the surface of the piezoelectric unit 20.

The material of the substrate 30 can be at least one of TPU (thermoplastic polyurethane), TPSiV, TPV (thermoplastic vulcanizate), TPE (thermoplastic elastomer), TPO (thermoplastic polyolefin), LSR (liquid silicone rubber), and HCR (high consistency rubber).

If any of the aforementioned materials are employed as the material for the substrate, processes such as inject molding, mold pressing or injection can be employed for formation of the substrate.

S52. Forming a deformation unit 10 over the surface of one side of the substrate 30 that is far away from the piezoelectric unit 20. The deformation unit 10 is configured to generate a mechanical force during deformation which then acts on the piezoelectric unit 20; the deformation unit 10 comprises a polymer film layer, and the polymer film layer comprises a conductive polymer.

Herein it is configured so as to maximize the mechanical force generated by the deformation of the deformation unit 10 and acted on the piezoelectric unit 20 to allow the piezoelectric unit to output voltage.

As such, by deforming the deformation unit 10, a mechanical force is generated and acted onto the piezoelectric unit 20, so that the piezoelectric unit 20 can output voltage under the action of the mechanical force, thereby realizing the power generation function.

In some embodiments of the present disclosure, the deformation unit 10 is only formed at one side of the piezoelectric unit 20.

In some embodiments, the piezoelectric unit 20 can have the structure as shown in FIG. 5, and as such the sub-step of forming the piezoelectric unit 20 can refer to the above-described sub-steps S20-S23.

In some embodiments, step S52 of forming the deformation unit 10 over the surface of one side of the substrate 30 that is far away from the piezoelectric unit 20 can be achieved through the following two methods.

Method 1, comprising the following sub-steps:

S60. Forming a polymer film layer with the conductive polymer material through coating process and curing process.

S61. Forming an adhesive layer over the polymer film layer.

Herein after forming the adhesive layer over the polymer film layer, a protective film can be bonded over the adhesive layer to protect the adhesiveness of the adhesive layer. Before executing the following step S32, the protective film can be removed.

S62. Aligning the polymer film layer and the substrate 30, and bonding the adhesive layer over the polymer film layer with the substrate 30, so that the polymer film layer can be formed over the surface of the substrate 30 that is far away from the piezoelectric unit 20.

Method 2, comprising the following sub-steps:

S70. Preparing a conductive polymer solution, wherein the conductive polymer solution comprises conductive polymer, solvent and resin. In the conductive polymer solution, the content of the conductive polymer can be 40%-85% wt, the content of the solvent can be 20%-60% wt, and content of the resin can be 5%-15% wt. It should be noted that the above-described contents of the conductive polymer, solvent and resin are all percentages by weight.

The conductive polymer may comprise at least one of poly(3,4-ethylenedioxythiophene), poly(styrenesulfonate), poly-phenylenevinylene, polypyrrole, polythiophene, polysilane, triphenylmethane, triarylamine, or pyrazoline.

The solvent may comprise at least one of a ketone, an ester, an ether, an aliphatic hydrocarbon, a naphthene-based compound, or an aromatic hydrocarbon.

The resin may comprise at least one of an acrylic resin or an epoxy acrylate resin copolymer.

S71. Coating the conductive polymer solution over the surface of one side of the substrate 30 that is far away from the piezoelectric unit 20.

S72. Curing the conductive polymer solution to form the polymer film layer.

Based on the above, in some embodiments, the substrate 30 can be formed over the surface of the piezoelectric unit 20 through injection molding process.

It should be noted, after the manufacturing of the polymer film layer, a non-dense protective layer can be formed over its surface through coating and curing process to prevent mechanical damages to the polymer film layer.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A user-wearable power generator having a skin-contact side and non-skin-contact side, comprising a deformation unit and a piezoelectric unit, wherein:

the deformation unit is coupled to the piezoelectric unit; and the deformation unit comprises a first conductive polymer including at least one of poly(3,4-ethylenedioxythiophene), poly(styrenesulfonate), poly-phenylenevinylene, polypyrrole, polythiophene, polysilane, triphenylmethane, triarylamine or pyrazoline, which is disposed at the skin-contact side and deforms upon contacting moisture from the user skin to thereby apply a mechanical force to the piezoelectric unit to thereby generate electricity.

2. The power generator of claim 1, wherein the piezoelectric unit comprises:
   a piezoelectric portion, comprising a piezoelectric material;
   two electrodes, coupled respectively to two sides of, and configured to output a voltage from, the piezoelectric portion when the piezoelectric portion generates electricity; and
   two electrode lead wires, coupled respectively to the two electrodes and configured to output the voltage outside the power generator.

3. The power generator of claims 2, wherein the piezoelectric material is a composite piezoelectric material, and the composite piezoelectric material comprises:
   a first substrate, comprising an organic polymer, and
   a piezoelectric composition, embedded in the first substrate.

4. The power generator of claim 3, wherein the piezoelectric composition is a piezoelectric ceramic or a piezoelectric crystal.

5. The power generator of claim 2, wherein the piezoelectric material is an organic piezoelectric material, comprising polyvinylidene fluoride.

6. The power generator of claim 2, wherein the piezoelectric unit further comprises two insulating layers, wherein:
   the two insulating layers are respectively disposed over the two electrodes, and configured to insulate from environment; and
   the two electrode lead wires each runs through one of the two insulating layers and has at least one part outside the one of the two insulating layers.

7. The power generator of claim 1, wherein the first conductive polymer is in direct contact with the piezoelectric unit.

8. The power generator of claim 3, further comprising a second substrate, wherein the second substrate is disposed between the first conductive polymer and the piezoelectric unit.

9. The power generator of claim 1, further comprising a second conductive polymer, disposed over a second side of the piezoelectric unit, and is configured to deform upon contacting moisture to thereby apply a second mechanical force to the piezoelectric unit.

10. An electronic device, comprising the power generator of claim 1, wherein the power generator is configured to supply at least part of electricity to the electronic device.

11. The electronic device of claim 10, wherein the electronic device is a wearable device, and the first conductive polymer in the power generator is disposed at a side of the electronic device in direct contact with skin of a subject.

* * * * *